(12) United States Patent
Nakamura et al.

(10) Patent No.: US 9,837,298 B2
(45) Date of Patent: Dec. 5, 2017

(54) METHOD FOR MANUFACTURING LAMINATE, METHOD FOR MANUFACTURING SEALED SUBSTRATE LAMINATE, SEALED SUBSTRATE LAMINATE, AND SEALED SUBSTRATE

(71) Applicant: Tokyo Ohka Kogyo Co., Ltd., Kawasaki-shi (JP)

(72) Inventors: Akihiko Nakamura, Kawasaki (JP); Kimihiro Nakada, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 153 days.

(21) Appl. No.: 14/940,506

(22) Filed: Nov. 13, 2015

(65) Prior Publication Data

US 2016/0163579 A1 Jun. 9, 2016

(30) Foreign Application Priority Data

Dec. 3, 2014 (JP) ................... 2014-245389

(51) Int. Cl.
*H01L 21/683* (2006.01)
*B32B 38/00* (2006.01)
(Continued)

(52) U.S. Cl.
CPC ........ *H01L 21/6835* (2013.01); *B32B 37/182* (2013.01); *B32B 38/0012* (2013.01); *H01L 21/4803* (2013.01); *H01L 21/565* (2013.01); *H01L 23/3121* (2013.01); *B32B 3/02* (2013.01); *B32B 3/085* (2013.01); *B32B 3/10* (2013.01); *B32B 3/30* (2013.01); *B32B 7/06* (2013.01); *B32B 7/12* (2013.01); *B32B 9/04* (2013.01); *B32B 27/283* (2013.01); *B32B 27/308* (2013.01); *B32B 38/10* (2013.01);

*B32B 2037/1253* (2013.01); *B32B 2037/268* (2013.01); *B32B 2038/0016* (2013.01); *B32B 2250/44* (2013.01); *B32B 2255/10* (2013.01); *B32B 2255/26* (2013.01); *B32B 2307/732* (2013.01); *B32B 2307/748* (2013.01); *B32B 2310/0831* (2013.01); *B32B 2457/08* (2013.01); *B32B 2457/14* (2013.01); *H01L 21/568* (2013.01); *H01L 2221/68318* (2013.01);
(Continued)

(58) Field of Classification Search
None
See application file for complete search history.

(56) References Cited

U.S. PATENT DOCUMENTS

2009/0075217 A1* 3/2009 Brodsky ............... G03F 7/2028
430/327
2009/0115075 A1* 5/2009 Kessel .................... B24B 7/228
257/787
2010/0330788 A1* 12/2010 Yu ......................... H01L 21/187
438/514

FOREIGN PATENT DOCUMENTS

| JP | 2012-166430 | 9/2012 |
| JP | 2012-187902 | 10/2012 |
| JP | 2013-123849 | 6/2013 |

* cited by examiner

*Primary Examiner* — Christopher Polley
(74) *Attorney, Agent, or Firm* — Knobbe Martens Olson & Bear LLP

(57) ABSTRACT

A laminate manufactured by forming a step difference in a substrate by grinding a periphery edge portion to have such a size that a surface on the inner side of the step difference can be housed in a cavity of a die, and then laminating the substrate, an adhesive layer, a release layer, and a support plate in this order such that the surface on the inner side of the step difference of the substrate faces the support plate.

5 Claims, 3 Drawing Sheets

Figure 1:
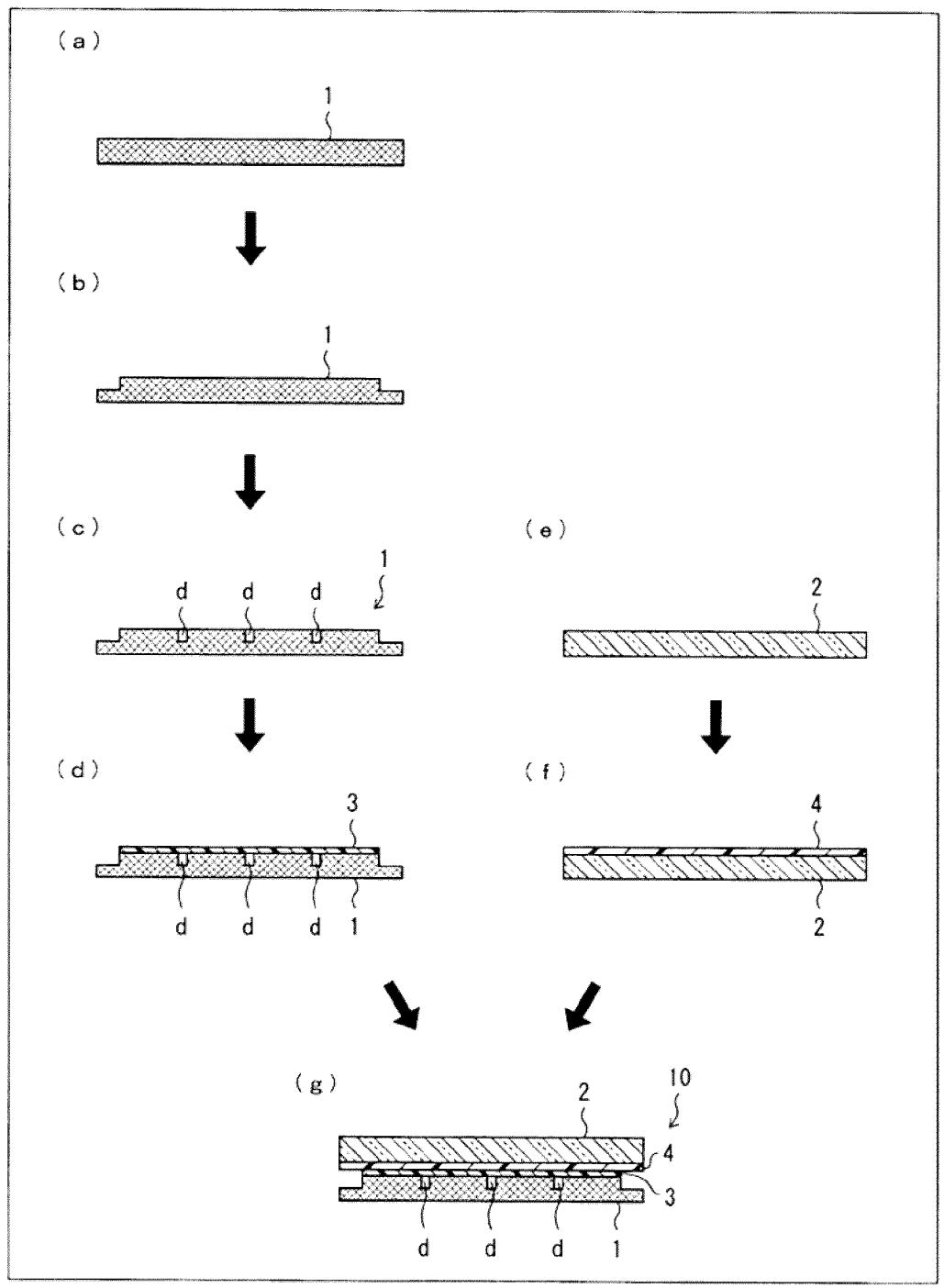

(51) Int. Cl.
  *H01L 21/48* (2006.01)
  *H01L 23/31* (2006.01)
  *B32B 37/18* (2006.01)
  *B32B 7/12* (2006.01)
  *B32B 38/10* (2006.01)
  *H01L 21/56* (2006.01)
  *B32B 37/26* (2006.01)
  *B32B 37/12* (2006.01)
  *B32B 7/06* (2006.01)
  *B32B 9/04* (2006.01)
  *B32B 27/28* (2006.01)
  *B32B 27/30* (2006.01)
  *B32B 3/02* (2006.01)
  *B32B 3/08* (2006.01)
  *B32B 3/10* (2006.01)
  *B32B 3/30* (2006.01)

(52) U.S. Cl.
  CPC ............... *H01L 2221/68331* (2013.01); *H01L 2221/68345* (2013.01); *H01L 2221/68381* (2013.01); *H01L 2924/0002* (2013.01); *H01L 2924/181* (2013.01)

METHOD FOR MANUFACTURING LAMINATE, METHOD FOR MANUFACTURING SEALED SUBSTRATE LAMINATE, SEALED SUBSTRATE LAMINATE, AND SEALED SUBSTRATE

CROSS-REFERENCE TO RELATED APPLICATIONS

Priority is claimed on Japanese Patent Application No. 2014-245389, filed Dec. 3, 2014, the content of which is incorporated herein by reference.

BACKGROUND OF THE INVENTION

Field of the Invention

The present invention relates to a method for manufacturing a laminate, a method for manufacturing a sealed substrate laminate, a sealed substrate laminate, and a sealed substrate.

Background Art

As mobile phones, digital AV devices, IC cards and the like become more highly functionalized, it is increasingly demanded that a semiconductor silicon chip (hereafter referred to as a "chip") be highly integrated in a package by making a mounted silicon chip smaller and thinner. For example, there is a demand for thinning of an integrated circuit obtained by packaging a plurality of chips in a package, such as a chip size package (CSP) and a multi-chip package (MCP). In order to realize high integration of a chip in a package, it is necessary to reduce the thickness of a chip to a range of 25 μm to 150 μm.

When the thickness of a wafer substrate is reduced, the strength of the wafer substrate decreases. Thus, structures such as a circuit are mounted on the wafer substrate while the wafer substrate is automatically transported in a state in which a support plate is bonded to the wafer substrate during the manufacturing process so as to prevent damage to the wafer substrate having a reduced thickness. In addition, in order to protect the mounted structures from light, heat, humidity, dust, and physical impact, the wafer substrate is sealed with a sealing material.

In JP-A-2013-123849 (published on Jun. 24, 2013), there is disclosed a resin sealing apparatus including a pair of dies that form a cavity, a porous film, and a sucking and fixing portion that sucks and fixes a workpiece through the porous film, in which the pair of dies are closed for sealing with resin while the sucking and fixing portion sucks and fixes a workpiece from a workpiece suction hole formed in a workpiece setting region through fine pores of the porous film.

In JP-A-2012-187902 (published on Oct. 4, 2012), there is disclosed a resin sealing method using a mold die in which a cavity recessed portion having a volume corresponding to a workpiece composed of a plurality of package regions is formed.

In JP-A-2012-166430 (published on Sep. 6, 2012), there is disclosed a resin sealing apparatus for sealing a workpiece with a resin in a cavity by moving a first die and a second die, which are provided to vertically face each other, closer to each other, and clamping the dies and extruding the resin supplied to a pot by a plunger which vertically moves to forcibly send the resin to the cavity through a cal and a gate.

However, the techniques disclosed in JP-A-2013-123849, JP-A-2012-187902, and JP-A-2012-166430, do not include a description of a technique of sealing a substrate of a laminate obtained by bonding a support to the substrate through an adhesive layer.

When a laminate is formed and a device which is mounted on the substrate of the laminate is sealed, a sealing material is injected into a space formed by the substrate of the laminate and a cavity of a die to seal the device on the substrate. Therefore, pressure force is applied to the laminate from the side of the die to the side of the substrate and the force is applied to the adhesive layer formed between the substrate and the support. Thus, there arises a problem of the adhesive layer protruding outward.

SUMMARY OF THE INVENTION

The invention has been made in view of the above-described problem and an object thereof is to provide a method for manufacturing a laminate capable of preventing an adhesive layer, which is formed between a substrate and a support from protruding outward by applying force to the adhesive layer when the substrate is sealed.

In order to address the above-described disadvantage, according to an aspect of the invention, there is provided a method for manufacturing a laminate including forming a step difference by grinding a periphery edge portion of a substrate to have such a size that the surface of the inner side of the step difference can be housed in a cavity of a die, and forming a laminate by laminating the substrate, an adhesive layer, a release layer altered by light absorption, and a support formed of a light transmitting material in this order after the forming of the step difference, in which in the forming of the laminate, the substrate is laminated such that the surface of the inner side of the step difference in the substrate faces the support.

According to the invention, the effect of manufacturing a laminate capable of preventing an adhesive layer which is formed between a substrate and a support from protruding outward by applying force to the adhesive layer when the substrate is sealed is exhibited.

BRIEF DESCRIPTION OF THE DRAWINGS (a) to (g) of FIG. 1 are schematic views illustrating processes before a laminate forming process in a method for manufacturing a laminate according to an embodiment of the invention.

Figure 2:
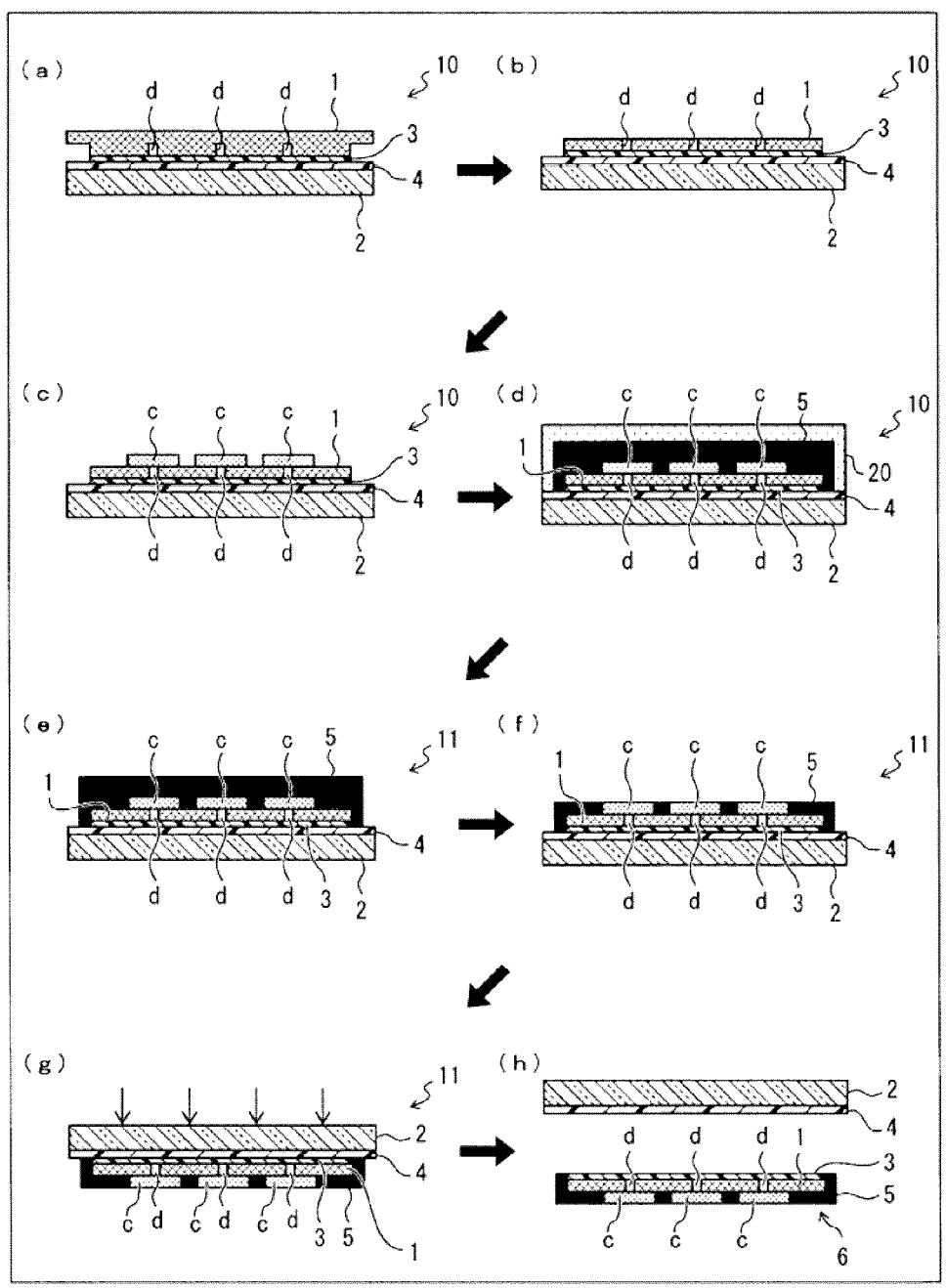

(a) to (h) of FIG. 2 are schematic views illustrating processes after a laminate forming process in the method for manufacturing a laminate according to the embodiment of the invention, a method of manufacturing a sealed substrate laminate, and a method of manufacturing a sealed substrate.

Figure 3A:
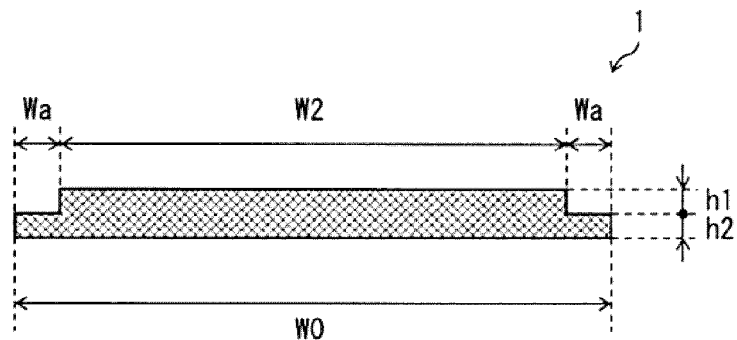
Figure 3B:
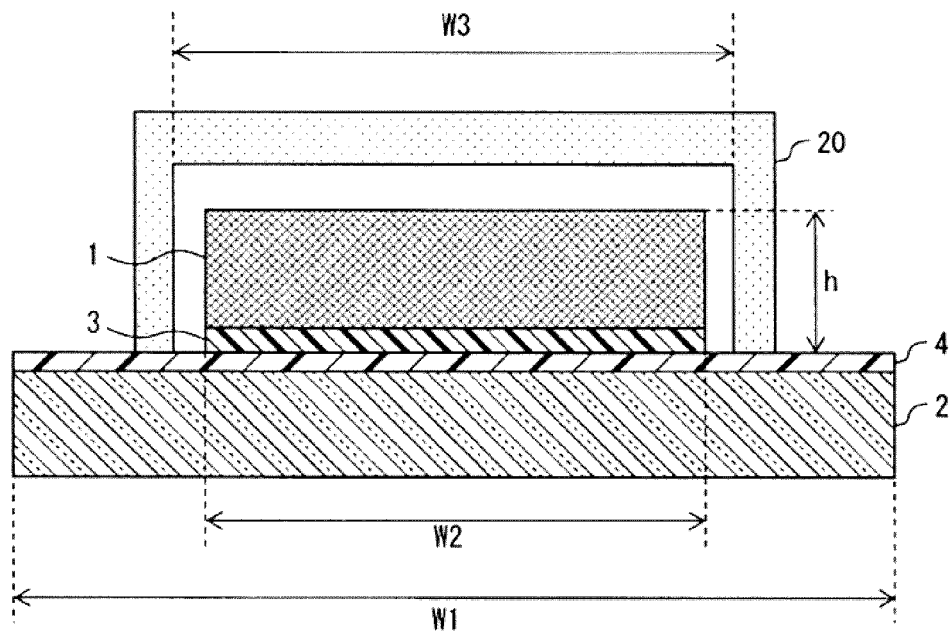

FIGS. 3A and 3B are schematic views illustrating a step difference to be formed on a substrate in a step difference forming process included in the method for manufacturing a laminate according to the embodiment and a state in which a laminate is set in a die.

DETAILED DESCRIPTION OF THE INVENTION

Method for Manufacturing Laminate

Using FIGS. 1 to 3B, a method for manufacturing a laminate according to an embodiment of the invention will be described in more detail.

A method for manufacturing a laminate 10 according to an embodiment includes a step difference forming process ((a) and (b) of FIG. 1) of forming a step difference by grinding a periphery edge portion of a substrate 1 to have such a size that a surface of the inner side of the step difference can be housed in a cavity of a die.

In addition, in the method for manufacturing the laminate 10 according to the embodiment, as shown in (c) of FIG. 1, an electrode d is formed inside the step difference that is formed on the substrate 1 in the step difference forming process.

Further, the method for manufacturing the laminate 10 according to the embodiment includes, an adhesive layer forming process ((d) of FIG. 1) of forming an adhesive layer 3 on the surface in which the step difference is formed in the substrate 1 after the step difference forming process, and a release layer forming process ((e) and (f) of FIG. 1) of forming a release layer 4 on a support plate (support) 2, and a laminate forming process ((g) of FIG. 1) of forming a laminate 10 by laminating the substrate 1, the adhesive layer 3, the release layer 4 altered by light absorption, and the support plate (support) 2 formed of a light transmitting material in this order, and in the laminate forming process, the substrate 1 is laminated such that the surface of the inner side of the step difference in the substrate 1 faces the support plate 2.

As shown in (a) and (b) of FIG. 2, the method for manufacturing the laminate 10 according to the embodiment further includes a thinning process of thinning the substrate 1 from the rear side of the facing surface in which the step difference is formed until the step difference is eliminated after the laminate forming process.

As shown in (a) and (b) of FIG. 2, by thinning the substrate 1 until the step difference is eliminated in the thinning process, the width of the substrate 1 is made to be the same size as the inner width of the step difference which has been formed in advance in the laminate 10. That is, it is possible to manufacture a laminate 10 formed by laminating the substrate 1 having an outer diameter smaller than the outer diameter of the support plate 2 (FIGS. 3A and 3B). In addition, the substrate 1 can be thinned by the thinning process until the substrate has a predetermined thickness. Thus, the electrode d can be exposed on the thinned surface of the substrate 1 in the laminate 10.

Further, in the method for manufacturing the laminate 10 according to the embodiment, as shown in (c) of FIG. 2, a device c is mounted on the electrode d exposed on the substrate 1 in the laminate 10.

Step Difference Forming Process

As shown in (a) and (b) of FIG. 1, in the step difference forming process, the step difference is formed by grinding the peripheral edge portion of the substrate 1. (a) of FIG. 1 is a schematic view illustrating the sectional surface of the substrate 1 in a thickness direction and (b) of FIG. 1 is a schematic view illustrating the sectional surface of the substrate 1 in the thickness direction after the step difference is formed. In addition, in the method for manufacturing the laminate according to the embodiment, after the step difference is formed on the substrate 1 in the step difference forming process, an electrode d is formed on the surface in which the step difference is formed in the substrate 1 ((c) of FIG. 1).

In the step difference forming process, as a method for forming the step difference in the peripheral edge portion of the substrate 1, for example, a method including fixing the substrate 1 to a rotatable fixing stand, and grinding the peripheral edge portion of the substrate 1 by a grinder or the like to a desired depth while rotating the substrate 1 can be used.

Substrate 1

The substrate 1 is typically a Si interposer or the like. In addition, although there is no limitation of the substrate, as shown in (a) of FIG. 1, the shape of the substrate 1 used in the method for manufacturing the laminate 10 according to the embodiment in a plane view is a flat circular shape and a notch (notched portion, not shown) for specifying the direction of the substrate 1 is formed in the peripheral edge portion of the substrate 1. As shown in (b) of FIG. 1, by grinding the peripheral edge portion of one surface of the substrate 1 in the step difference forming process, a step difference is formed in the peripheral edge portion of the substrate 1. Therefore, the notch shape can remain in the peripheral edge portion of the surface in which the peripheral edge portion is not ground in the substrate 1.

Step Difference

Using FIGS. 3A and 3B, a step difference to be formed on the substrate 1 will be described in more detail. FIG. 3A is a schematic view illustrating a step difference to be formed on the substrate 1.

As shown in FIG. 3A, a step difference having a width Wa as a width in a horizontal direction and a width h1 as a width in a thickness direction on one surface of the flat substrate 1 having an outer diameter W0 is cut in the peripheral edge portion of the substrate 1. Thus, the surface on the inner side of the step difference in the surface in which the step difference is cut in the substrate 1 has an outer diameter W2. That is, a step difference is formed on the substrate 1 such that as shown in FIG. 3B, the outer diameter W2 of the surface on the inner side of the step difference of the substrate 1 becomes smaller than an inner diameter W3 of the cavity of the die.

The width Wa of the step difference of the substrate 1 may be appropriately adjusted in consideration of the support plate which forms a laminate and an inner diameter W3 of a cavity of a die 20. For example, when a substrate which is a substrate having an outer diameter of 300 mm is used and a step difference is formed on the substrate, the width Wa of the substrate 1 is preferably 4 mm or more and more preferably 5 mm or more. When the width Wa of the substrate 1 is 4 mm or more, a sufficient difference between the outer diameter W1 of the support plate 2 and the outer diameter W2 of the substrate can be provided. Thus, in order to manufacture a laminate in which the substrate 1 can be housed in the cavity of the die and the cavity can be suitably covered with the support plate 2, the substrate 1 can be appropriately processed. In addition, the width Wa of the substrate 1 is more preferably a width within a range of 10 mm or less. Thus, a device can be mounted on the surface on the inner side of the step difference in the substrate 1 with a high yield.

As shown in FIG. 3A, the width h1 of the step difference of the substrate 1 in the thickness direction of the substrate 1 may be such a width that, when the substrate 1 is ground from the rear side of the surface of the substrate 1 in which the step difference is formed until the step difference is eliminated in the following thinning process, a predetermined thickness can be secured in the substrate 1. That is, the width h1 of the step difference of the substrate 1 may be such a width that a thickness within a range of 20 μm to 150 μm can be secured for the thickness of the substrate 1 after the thinning process is performed.

Formation of Electrode d

In addition, as shown in (c) of FIG. 1, an electrode d is formed in the flat surface portion of the inner side of the step difference in the surface in which the step difference is formed in the substrate 1. Since a notched shape (not shown)

remains on the surface having an outer diameter W0 shown in FIG. 3A in the substrate 1, the electrode d can be formed on the flat surface portion of the inner side of the step difference in the substrate 1 by specifying the direction of the substrate 1 based on the notch. The electrode d may be formed by a known process such as a photolithography process, an etching process, or chemical vapor deposition (CVD).

Adhesive Layer Forming Process

As shown in (d) of FIG. 1, in the adhesive layer forming process, an adhesive layer 3 is formed by applying an adhesive to the surface in which the step difference is formed in the substrate 1.

Adhesive Layer 3

As a method for forming the adhesive layer 3, an adhesive may be applied to the substrate 1 or an adhesive tape having both surfaces to which an adhesive is applied may be attached to the substrate 1. A method for applying the adhesive is not particularly limited and for example, coating methods such as a spin coating method, a dipping method, a roller blade method, a doctor blade method, a spray method, and a slit nozzle method can be used. In addition, after the adhesive is applied to the substrate, the adhesive may be dried by heating. Further, instead of directly applying the adhesive to the substrate 1, a film having both surfaces to which an adhesive is applied in advance (a so-called dry film) may be bonded to the substrate 1.

The thickness of the adhesive layer may be appropriately set according to the types of the substrate 1 and the support plate 2 to be bonded, a treatment to be performed on the substrate 1 after bonding, and the like. However, the thickness is preferably within a range of 10 µm to 150 µm and more preferably within a range of 15 µm to 100 µm.

The adhesive layer formed on the step difference of the substrate 1 and the adhesive layer formed in a position away from the peripheral edge of the substrate 1 having a width W2 toward the inside within a range of 0.5 mm to 1.0 mm may be removed by, for example, being dissolved in a solvent or the like. When the peripheral edge portion is removed as described above, the thickness of the adhesive layer 3 may be, for example, about 50 µm. Thus, in the laminate forming process, the adhesive layer 3 can be favorably prevented from protruding from the laminate 10.

Adhesive Layer 3

The adhesive layer 3 is a layer formed by an adhesive used for bonding the support plate 2 to the substrate 1.

Examples of the adhesive which can be used for forming the adhesive layer 3 according to the present invention include various adhesives known in the field, such as acrylic adhesives, novolac adhesives, naphthoquinone adhesives, hydrocarbon adhesives, polyimide adhesives, and elastomers, and for example, adhesives including a hydrocarbon resin, an acrylic-styrene-based resin, a maleimide-based resin, an elastomer resin, and a thermoplastic resin obtained by combining these resins can be used.

Hydrocarbon Resin

The hydrocarbon resin is a resin having a hydrocarbon skeleton and formed by polymerizing a monomer composition. Examples of the hydrocarbon resin include a cycloolefin-based polymer (hereinafter, also referred to as "resin (A)"), or at least one resin (hereinafter, also referred to as "resin (B)") selected from the group consisting of a terpene resin, a rosin-based resin and a petroleum-based resin, but are not limited thereto.

The resin (A) may be a resin formed by polymerizing a monomer component including a cycloolefin-based monomer. Specifically, a ring-opened (co)polymer of a monomer component including the cycloolefin-based monomer, and a resin obtained by addition-(co)polymerizing the monomer component including the cycloolefin-based monomer.

Examples of the cycloolefin-based monomer included in the monomer component constituting the resin (A) include bicyclic compounds such as norbornene, norbornadiene, tricyclic compounds such as dicyclopentadiene, hydroxy-dicyclopentadiene, tetracyclic compounds such as tetracyclododecene, pentacyclic compounds such as cyclopentadiene trimer, heptacyclic compounds such as tetracyclopentadiene, or alkyl (methyl, ethyl, propyl, or butyl) substituents, alkenyl (such as vinyl) substituents, alkylidene (such as ethylidene) substituents, and aryl (such as phenyl, tolyl, or naphthyl) substituents of the polycyclic compounds. Among these, in particular, a norbornene-based monomer selected from the group consisting of the norbornene, the tetracyclododecene, or the alkyl substituents thereof is preferable.

The monomer component constituting the resin (A) may contain other monomers which can be copolymerized with the above-described cycloolefin-based monomers, and preferably contains, for example, an alkene monomer. Examples of the alkene monomer include ethylene, propylene, 1-butene, isobutene, 1-hexene, and α-olefin. The alkene monomer may be linear or branched.

In addition, the cycloolefin monomer is preferably contained as the monomer component constituting the resin (A) from the viewpoint of a high heat resistance (low pyrolytic property and thermal weight loss property). A ratio of the cycloolefin monomer with respect to the entire monomer component constituting the resin (A) is preferably 5 mol % or more, more preferably 10 mol % or more, and still more preferably 20 mol % or more. In addition, the ratio of the cycloolefin monomer with respect to the entire monomer component constituting the resin (A), which is not particularly limited, is preferably 80 mol % or less, and more preferably 70 mol % or less from the viewpoint of solubility and stability with time in a solution.

In addition, a linear or branched alkene monomer may be contained as the monomer component constituting the resin (A). A ratio of the alkene monomer with respect to the entire monomer component constituting the resin (A) is preferably 10 mol % to 90 mol %, more preferably 20 mol % to 85 mol %, and still more preferably 30 mol % to 80 mol % from the viewpoint of solubility and flexibility.

Moreover, for example, as the resin (A), a resin not having a polar group as a resin obtained by polymerizing a monomer component formed of the cycloolefin-based monomer and the alkene monomer is preferable for suppressing generation of gas at a high temperature.

The polymerization method and the polymerization conditions when the monomer component is polymerized are not particularly limited, and may be appropriately set according to common methods.

Examples of commercially available products that can be used as a resin (A) include "TOPAS" manufactured by POLYPLASTICS Co., Ltd., "APEL" manufactured by Mitsui Chemicals, Inc., "ZEONEX" and "ZEONOR" manufactured by ZEON CORPORATION, and "ARTON" manufactured by JSR Corporation.

For example, it is possible to use the cycloolefin copolymer which is a copolymer having a repeating unit represented by the following formula (1) and a repeating unit represented by the following formula (2), as a resin of an adhesive component.

[Chemical formula 1]

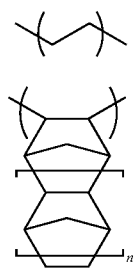

(In formula (2), n represents 0 or an integer of 1 to 3.)

As the cycloolefin copolymer, APL 8008T, APL 8009T, and APL 6013T (all manufactured by Mitsui Chemicals, Inc.) can be used.

A glass transition temperature (Tg) of the resin (A) is preferably 60° C. or higher, and particularly preferably 70° C. or higher. In a case in which the glass transition temperature of the resin (A) is 60° C. or higher, when the laminate is exposed to a high temperature environment, it is possible to further suppress softening of the adhesive layer 3.

The resin (B) is at least one resin selected from the group consisting of the terpene-based resin, the rosin-based resin, and the petroleum-based resin. Specifically, examples of the terpene-based resin include a terpene resin, a terpene phenol resin, a modified terpene resin, a hydrogenated terpene resin, and a hydrogenated terpene phenol resin. Examples of the rosin-based resin include rosin, a rosin ester, hydrogenated rosin, a hydrogenated rosin ester, polymerized rosin, a polymerized rosin ester, and modified rosin. Examples of the petroleum-based resin include an aliphatic or aromatic petroleum resin, a hydrogenated petroleum resin, a denatured petroleum resin, an alicyclic petroleum resin, and a coumarone-indene petroleum resin. Among these, a hydrogenated terpene resin, and a hydrogenated petroleum resin are more preferable.

A softening point of the resin (B) is not particularly limited and is preferably 80° C. to 160° C. In the case in which the softening point of the resin (B) is 80° C. to 160° C., when the laminate is exposed to a high temperature environment, it is possible to suppress softening and an adhesive failure does not occur.

The weight average molecular weight of the resin (B) is not particularly limited and is preferably 300 to 3,000. When the weight average molecular weight of the resin (B) is 300 or more, heat resistance becomes sufficient, and the amount of degasification is reduced under a high temperature environment. On the other hand, when the weight average molecular weight of the resin (B) is 3,000 or less, the dissolving rate of the adhesive layer in a hydrocarbon-based solvent becomes excellent. Therefore, the residue of the adhesive layer on the substrate after the support is separated can be quickly dissolved and removed. The weight average molecular weight of the resin (B) in the embodiment means a molecular weight in terms of polystyrene measured using a gel permeation chromatography (GPC).

As the resin, the resins (A) and (B) may be used as a mixture. By mixing the resins, the heat resistance becomes excellent. For example, the mixing ratio between the resin (A) and the resin (B) is preferably (A):(B)=80:20 to 55:45 (mass ratio) since the heat resistance under the high temperature environment and flexibility are excellent.

Acrylic-Styrene-Based Resin

Examples of the acrylic-styrene-based resin include resins which are polymerized using styrene or styrene derivatives, and (meth)acrylic acid esters as a monomer.

Examples of the (meth)acrylic acid ester include (meth)acrylic acid alkyl ester formed of a chain structure, (meth)acrylic acid ester having an aliphatic ring, and (meth)acrylic acid ester having an aromatic ring. Examples of the (meth)acrylic acid alkyl ester formed of a chain structure include acrylic long chain alkyl ester having an alkyl group with 15 to 20 carbon atoms, and acrylic alkyl ester having an alkyl group with 1 to 14 carbon atoms. Examples of the acrylic long chain alkyl ester include alkyl esters of an acrylic acid or a methacrylic acid in which the alkyl group is an n-pentadecyl group, an n-hexadecyl group, an n-heptadecyl group, an n-octadecyl group, an n-nonadecyl group, or an n-eicosyl group. Moreover, the alkyl group may be branched.

Examples of the acrylic alkyl ester having an alkyl group with 1 to 14 carbon atoms include known acrylic alkyl ester used in an existing acrylic adhesive. For example, alkyl esters of an acrylic acid or a methacrylic acid in which the alkyl group is a methyl group, an ethyl group, a propyl group, a butyl group, a 2-ethylhexyl group, an isooctyl group, an isononyl group, an isodecyl group, a dodecyl group, a lauryl group, and a tridecyl group are exemplified.

Examples of the (meth)acrylic acid ester having an aliphatic ring include cyclohexyl (meth)acrylate, cyclopentyl (meth)acrylate, 1-adamantyl (meth)acrylate, norbornyl (meth)acrylate, isobornyl (meth)acrylate, tricyclodecanyl (meth)acrylate, tetracyclododecanyl (meth)acrylate, and dicyclopentanyl (meth)acrylate, and isobornyl methacrylate and dicyclopentanyl (meth)acrylate are more preferable.

The (meth)acrylic acid ester having an aromatic ring is not particularly limited, and examples of the aromatic ring include a phenyl group, a benzyl group, a tolyl group, a xylyl group, a biphenyl group, a naphthyl group, an anthracenyl group, a phenoxymethyl group, and a phenoxyethyl group. In addition, the aromatic ring may have a linear or a branched alkyl group having 1 to 5 carbon atoms. Specifically, phenoxyethylacrylate is preferable.

Maleimide-Based Resin

Examples of the maleimide-based resin include resins obtained by polymerizing maleimides having an alkyl group such as N-methyl maleimide, N-ethyl maleimide, N-n-propyl maleimide, N-isopropyl maleimide, N-n-butyl maleimide, N-iso-butyl maleimide, N-sec-butyl maleimide, N-tert-butyl maleimide, N-n-pentyl maleimide, N-n-hexyl maleimide, N-n-heptyl maleimide, N-n-octyl maleimide, N-lauryl maleimide, and N-stearyl maleimide, maleimides having an aliphatic hydrocarbon group such as N-cyclopropyl maleimide, N-cyclobutyl maleimide, N-cyclopentyl maleimide, N-cyclohexyl maleimide, N-cycloheptyl maleimide, and N-cyclooctyl maleimide, and aromatic maleimides having an aryl group such as N-phenyl maleimide, N-m-methyl phenyl maleimide, N-o-methyl phenyl maleimide, and N-p-methyl phenyl maleimide, as a monomer.

Elastomer

An elastomer preferably includes a styrene unit as a constituent unit of a main chain, and the "styrene unit" may have a substituent. Examples of the substituent include an alkyl group having 1 to 5 carbon atoms, an alkoxy group having 1 to 5 carbon atoms, an alkoxyalkyl group having 1 to 5 carbon atoms, an acetoxy group, and a carboxyl group. In addition, the content of the styrene unit is more preferably within the range of 14% by weight to 50% by weight.

Further, the weight average molecular weight of the elastomer is preferably within the range of 10,000 to 200,000.

When the content of the styrene unit is within the range of 14% by weight to 50% by weight, and the weight average molecular weight of an elastomer is within the range of 10,000 to 200,000, the adhesive layer can be removed more easily and quickly since the adhesive is easily dissolved in hydrocarbon-based solvents which will be described later. In addition, when the content of the styrene unit and the weight average molecular weight are in the above-described ranges, excellent resistance is exhibited with respect to resist solvents (for example, PGMEA, PGME and the like), acid (hydrofluoric acid and the like), and alkali (TMAH and the like) to which a wafer is exposed when the wafer is subjected to a resist lithography process.

Moreover, the above-described (meth)acrylic acid ester may be further mixed in the elastomer.

In addition, the content of the styrene unit is more preferably 17% by weight or more and 40% by weight or less.

The weight average molecular weight is more preferably within a range of 20,000 to 150,000.

As the elastomer, various elastomers of which the content of the styrene unit is within the range of 14% by weight to 50% by weight, and of which the weight average molecular weight is within the range of 10,000 to 200,000 can be used. Examples of the elastomer include a polystyrene-poly(ethylene/propylene) block copolymer (SEP), a styrene-isoprene-styrene block copolymer (SIS), a styrene-butadiene-styrene block copolymer (SBS), a styrene-butadiene-butylene-styrene block copolymer (SBBS), and hydrogenated products thereof, a styrene-ethylene-butylene-styrene block copolymer (SEBS), a styrene-ethylene-propylene-styrene block copolymer (styrene-isoprene-styrene block copolymer) (SEPS), a styrene-ethylene-ethylene-propylene-styrene block copolymer (SEEPS), a styrene-ethylene-ethylene-propylene-styrene block copolymer (Septon V9461 (manufactured by KURARAY Co., Ltd.)) of which the styrene block is a reaction crosslinking type, Septon V9475 (manufactured by KURARAY Co., Ltd.), a styrene-ethylene-butylene-styrene block copolymer (having a reactive polystyrene-based hard block, Septon V9827 (manufactured by KURARAY Co., Ltd.)) of which the styrene block is a reaction crosslinking type, and a polystyrene-poly(ethylene-ethylene/propylene) block-polystyrene block copolymer (SEEPS-OH: of which the end is modified with a hydroxyl group), and elastomers of which the content of the styrene unit and the weight average molecular weight are in the above ranges can be used.

In addition, among the elastomers, a hydrogenated product is more preferable. The hydrogenated product has improved stability with respect to heat, and alteration such as decomposition and polymerization does not easily occur. In addition, the hydrogenated product is more preferable also from the viewpoint of solubility in hydrocarbon-based solvents and resistance to resist solvents.

In addition, among the elastomers, an elastomer of which both terminals are block polymers of styrene is more preferable. This is because higher heat resistance is exhibited by blocking styrene having high heat stability at both terminals thereof.

More specifically, the elastomer is more preferably a hydrogenated product of a block copolymer of styrene and conjugated diene. Stability with respect to heat is improved, and alternation such as decomposition and polymerization does not easily occur. In addition, higher heat resistance is exhibited by blocking styrene having high heat stability at both terminals thereof. Furthermore, the elastomer is more preferable also from the viewpoint of solubility in hydrocarbon-based solvents and resistance to resist solvents.

Examples of commercially-available products, which can be used as the elastomer included in the adhesive constituting the adhesive layer 3, include "Septon (product name)" manufactured by KURARAY Co., Ltd., "HYBRAR (product name)" manufactured by KURARAY Co., Ltd., "Tuftec (product name)" manufactured by Asahi Kasei Corporation, and "DYNARON (product name)" manufactured by JSR Corporation.

For example, the content of the elastomer included in the adhesive constituting the adhesive layer 3 is preferably within a range of 50 parts by weight to 99 parts by weight, more preferably within a range of 60 parts by weight to 99 parts by weight, and most preferably within a range of 70 parts by weight to 95 parts by weight when the total amount of the adhesive composition is 100 parts by weight. By setting in these ranges, it is possible to suitably bond a wafer to the support while maintaining heat resistance.

In addition, plural types of elastomers may be used as a mixture. That is, the adhesive constituting the adhesive layer 3 may include plural types of elastomers. At least one among plural types of elastomers more preferably includes a styrene unit as a constituent unit of a main chain. Further, regarding at least one among plural types of elastomers, when the content of the styrene unit is within the range of 14% by weight to 50% by weight, or when the weight average molecular weight is within the range of 10,000 to 200,000, it is encompassed in the scope of the invention. In addition, in a case in which plural types of elastomers are included in the adhesive constituting the adhesive layer 3, as a result of mixing, the content of the styrene unit may be adjusted to be in the above range. For example, when Septon 4033 of Septon (product name) manufactured by KURARAY Co., Ltd. of which the content of the styrene unit is 30% by weight and Septon 2063 of Septon (product name) manufactured by KURARAY Co., Ltd. of which the content of the styrene unit is 13% by weight are mixed at a weight ratio of 1:1, the content of styrene with respect to the entire elastomer contained in the adhesive becomes 21% by weight to 22% by weight, and thus, becomes 14% by weight or more. In addition, for example, when an elastomer of which the styrene unit is 10% by weight and an elastomer of which the styrene unit is 60% by weight are mixed at a weight ratio of 1:1, the content of styrene becomes 35% by weight, and thus the content is in the above-described range. The invention may employ such an embodiment. Further, it is most preferable that all of the plural types of elastomers which are included in the adhesive constituting the adhesive layer 3 include the styrene unit in the above-described range, and the weight average molecular weight is in the above-described range.

It is preferable that the adhesive layer 3 is formed using resins other than a photocurable resin (for example, UV curable resin). When resins other than a photocurable resin are used, it is possible to prevent a residue from remaining in the periphery of minute unevenness in a substrate to be supported after the adhesive layer 3 is peeled off or removed. Particularly, it is preferable that the adhesive constituting the adhesive layer 3 is dissolved not in every solvent but in a specific solvent. This is because the adhesive layer 3 can be removed by dissolving the adhesive layer in a solvent without applying physical force to the substrate 1. When the adhesive layer 3 is removed, the adhesive layer 3 can be easily removed even from the substrate 1 having reduced strength without damaging or deforming the substrate 1.

Diluent Solvent

Examples of a diluent solvent used when forming the adhesive layer 3 include a linear hydrocarbons such as hexane, heptane, octane, nonane, methyloctane, decane, undecane, dodecane, and tridecane, branched hydrocarbons having 4 to 15 carbon atoms, cyclic hydrocarbons such as cyclohexane, cycloheptane, cyclooctane, naphthalene, decahydronaphthalene, and tetrahydronaphthalene, terpene-based solvents such as p-menthane, o-menthane, m-menthane, diphenyl menthane, 1,4-terpine, 1,8-terpine, bornane, norbornane, pinane, thujane, carane, longifolene, geraniol, nerol, linalool, citral, citronellol, menthol, isomenthol, neomenthol, α-terpineol, β-terpineol, γ-terpineol, terpinene-1-ol, terpinene-4-ol, dihydroterpinylacetate, 1,4-cineol, 1,8-cineol, borneol, carvone, ionone, thujone, camphor, d-limonene, 1-limonene, and dipentene; lactones such as γ-butyrolactone; ketones such as acetone, methylethylketone, cyclohexanone (CH), methyl-n-pentylketone, methylisopentylketone, and 2-heptanone; polyalcohols such as ethylene glycol, diethylene glycol, propylene glycol, and dipropylene glycol; compounds having an ester bond such as ethyleneglycol monoacetate, diethylene glycol monoacetate, propylene glycol monoacetate, or dipropylene glycol monoacetate, derivatives of polyalcohols such as compounds having an ether bond such as monoalkyl ether such as monomethyl ether, monoethyl ether, monopropyl ether, monobutyl ether or monophenyl ether of the polyalcohols or the compounds having the ester bond, (among these, propylene glycol monomethyl ether acetate (PGMEA) and propylene glycol monomethyl ether (PGME) are preferable), cyclic ethers such as dioxane, esters such as methyl lactate, ethyl lactate (EL), methyl acetate, ethyl acetate, butyl acetate, methoxy butyl acetate, methyl pyruvate, ethyl pyruvate, methyl methoxypropionate, and ethyl ethoxypropionate; and aromatic organic solvents such as anisole, ethylbenzyl ether, cresylmethyl ether, diphenyl ether, dibenzyl ether, phenetole, and butylphenyl ether.

Other Components

The adhesive constituting the adhesive layer 3 can further include another miscible substance in such a range that no essential feature is impaired. For example, various additives commonly used to improve the performance of the adhesive such as an additive resin, a plasticizer, an adhesion auxiliary substance, a stabilizer, a colorant, a thermal polymerization inhibitor and a surfactant can further be used.

Release Layer Forming Process

In the release layer forming process, a release layer 4 altered by light irradiation is formed on the support plate 2 formed of a light transmitting material shown in (e) of FIG. 1 ((f) of FIG. 1).

The release layer 4 is provided on the surface to which the substrate 1 is bonded through the adhesive layer 3 in the support plate 2.

For example, the thickness of the release layer 4 is more preferably within a range of 0.05 µm to 50 µm, and still more preferably within a range of 0.3 µm to 1 µm. When the thickness of the release layer 4 is within a range of 0.05 µm to 50 µm, a desired alteration can be generated in the release layer 4 by light irradiation for a short period of time and light irradiation having low energy. In addition, the thickness of the release layer 4 is particularly preferably within the range of 1 µm or less from the viewpoint of productivity.

In the laminate 10, another layer may be further formed between the release layer 4 and the support plate 2. In this case, the another layer may be constituted by a light transmitting material. Thus, it is possible to appropriately add a layer which provides desirable properties to the laminate 10 without preventing the incidence of light into the release layer 4. The wavelength of light which can be used is different depending on the type of material constituting the release layer 4. Thus, the material constituting the another layer can be appropriately selected from materials which can transmit light having a wavelength that can alter the material constituting the release layer 4, and the materials are not required to transmit all light.

In addition, the release layer 4 is preferably formed only of a material having a structure which absorbs light, but the release layer 4 may be formed by adding a material not having a structure which absorbs light in such a range where no essential feature of the present invention is impaired. Further, a surface of the side opposite to the adhesive layer 3 in the release layer 4 is preferably flat (irregularities are not formed). Thus, it is possible to easily form the release layer 4, and to perform uniform bonding at the time of bonding.

Support Plate 2

The support plate (support) 2 shown in (e) of FIG. 1 may transmit the light to alter the release layer 4. From the above viewpoint, as the support plate 2, supports formed of, for example, glass, silicon, or an acrylic resin.

In addition, the shape of the support plate 2 is a flat circular shape which is the same shape as the shape of the substrate 1 in a plan view and a notch (notched portion, not shown) for specifying the direction of the support plate 2 is formed in the peripheral edge portion of the support plate 2. In the method for manufacturing the laminate 10 according to the embodiment, the outer diameter of the support plate 2 to be used, is the same as the outer diameter of the substrate 1.

Release Layer 4

The release layer 4 refers to a layer formed of a material that is altered by absorbing light emitted through the support plate 2.

The material constituting the release layer 4 is not particularly limited as long as the release layer can be formed on the support plate 2 using the material by a plasma CVD method and altered by absorbing light. Examples of the material include fluorocarbon, inorganic substances, polymers including a structure having light absorption properties in a repeating unit thereof, compounds having a structure with infrared ray absorption properties, and infrared ray absorbing substances.

Fluorocarbon

The release layer 4 may be formed of fluorocarbon. When the release layer 4 is formed of fluorocarbon, the release layer 4 is altered by absorbing light, and as a result, the release layer loses strength or adhesiveness before the layer is irradiated with light. Therefore, by applying a slight external force (for example, lifting the support plate 2), the release layer 4 is broken, and thus it is possible to easily separate the support plate 2 and the substrate 1. A film can be suitably formed using the fluorocarbon constituting the release layer 4 by a plasma chemical vapor deposition (CVD) method.

The fluorocarbon absorbs light having a wavelength in the specific range depending on the type. By irradiating the release layer with light having a wavelength within the range that fluorocarbon used in the release layer 4 absorbs, fluorocarbon may be suitably altered. The light absorption efficiency of the release layer 4 is preferably 80% or more.

As the light with which the release layer 4 is irradiated, laser light such as solid-state laser such as YAG laser, ruby laser, glass laser, $YVO_4$ laser, LD laser, and fiber laser, liquid laser such as dye laser, gas laser such as $CO_2$ laser, eximer laser, Ar laser, and He—Ne laser, semiconductor laser and free electron laser, or non-laser light may be used appropriately according to the wavelength which can be absorbed by the fluorocarbon. The wavelength of the light to alter fluorocarbon is not limited thereto but, for example, can be the light having a wavelength within a range of 600 nm or less.

Polymer Including Structure Having Light Absorption Properties in Repeating Unit Thereof The release layer 4 may contain a polymer containing a structure having light absorption properties in the repeating unit thereof. The polymer is altered by irradiation of light. The polymer is altered when the structure absorbs light with which it is irradiated. As a result of the alteration of the polymer, the release layer 4 loses the strength and the adhesiveness before being irradiated with light. Therefore, by applying a slight external force (for example, lifting the support plate 2), the release layer 4 is broken, and thus it is possible to easily separate the support plate 2 and the substrate 1.

The structure having light absorption properties is a chemical structure that alters the polymer containing the structure as the repeating unit by absorbing light. For example, the structure is an atomic group containing a conjugated π-electron system formed of a substituted or unsubstituted benzene ring, a condensed ring or a heterocyclic ring. More specifically, the structure may be a cardo structure, a benzophenone structure present at the side chain of the polymer, a diphenyl sulfoxide structure, a diphenyl sulfone structure (bisphenyl sulfone structure), a diphenyl structure or a diphenylamine structure.

In the case in which the structure is present at the side chain of the polymer, the structure can be represented by the following formulae.

[Chemical formula 2]

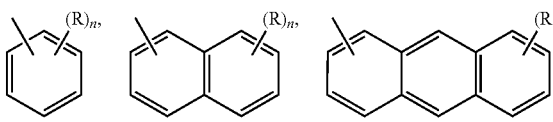

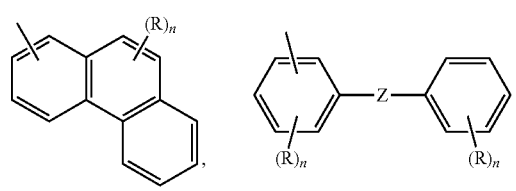

(In the formulae, R each independently represent an alkyl group, an aryl group, a halogen, a hydroxyl group, a ketone group, a sulfoxide group, a sulfone group or N(R$^1$) (R$^2$) (where R$^1$ and R$^2$ each independently represent a hydrogen atom or an alkyl group having 1 to 5 carbon atoms), Z is absent or represents —CO—, —SO$_2$—, —SO— or —NH—, and n represents 0 or an integer of 1 to 5.)

In addition, for example, the polymer contains a repeating unit represented by any one of (a) to (d), is represented by (e), or includes a structure of (f) in the main chain among the following formulae.

[Chemical formula 3]

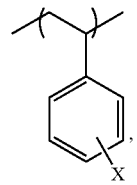
(a)

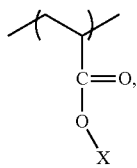
(b)

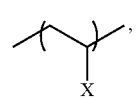
(c)

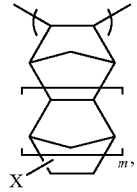
(d)

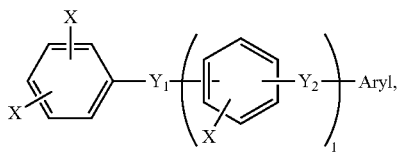
(e)

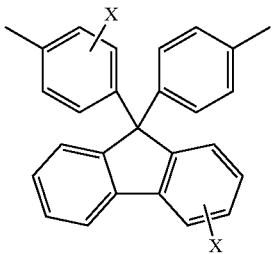
(f)

(In the formulae, l is an integer of 1 or greater, m is 0 or an integer of 1 to 2, X is any one of the formulae shown in "Chemical formula 2" described above in (a) to (e), any one of the formulae shown in "Chemical formula 2" described above in (f), or is absent, and Y$_1$ and Y$_2$ represent each independently —CO— or —SO$_2$—. l is preferably an integer of 10 or less.)

Examples of a benzene ring, a condensed ring and a heterocyclic ring shown in "Chemical formula 2" above include phenyl, substituted phenyl, benzyl, substituted benzyl, naphthalene, substituted naphthalene, anthracene, substituted anthracene, anthraquinone, substituted anthraquinone, acridine, substituted acridine, azobenzene, substituted azobenzene, fluorim, substituted fluorim, fluorimon, substituted fluorimon, carbazole, substituted carbazole, N-alkyl-carbazole, dibenzofuran, substituted dibenzofuran, phenanthrene, substituted phenanthrene, pyrene and substituted pyrene. In the case in which the exemplified substituent has a substitution, for example, the substituent can be selected from alkyl, aryl, a halogen atom, alkoxy, nitro, aldehyde, cyano, amide, dialkylamino, sulfonamide, imide, carboxylic acid, carboxylic ester, sulfonic acid, sulfonic ester, alkylamino and arylamino.

Among the substituents shown in "Chemical formula 2" above, examples of the case in which a substituent is a fifth substituent having two phenyl groups, and Z is —SO$_2$— include
bis(2,4-dihydroxyphenyl)sulfone,
bis(3,4-dihydroxyphenyl)sulfone,
bis(3,5-dihydroxyphenyl)sulfone,
bis(3,6-dihydroxyphenyl)sulfone,
bis(4-hydroxyphenyl)sulfone, bis(3-hydroxyphenyl)sulfone,
bis(2-hydroxyphenyl)sulfone, and
bis(3,5-dimethyl-4-hydroxyphenyl)sulfone.

Among the substituents shown in "Chemical formula 2" above, examples of the case in which a substituent is a fifth substituent having two phenyl groups, and Z is —SO— include,
bis(2,3-dihydroxyphenyl)sulfoxide,
bis(5-chloro-2,3-dihydroxyphenyl)sulfoxide,
bis(2,4-dihydroxyphenyl)sulfoxide,
bis(2,4-dihydroxy-6-methylphenyl)sulfoxide,
bis(5-chloro-2,4-dihydroxyphenyl)sulfoxide,
bis(2,5-dihydroxyphenyl)sulfoxide,
bis(3,4-dihydroxyphenyl)sulfoxide,
bis(3,5-dihydroxyphenyl)sulfoxide,
bis(2,3,4-trihydroxyphenyl)sulfoxide,
bis(2,3,4-trihydroxy-6-methylphenyl)-sulfoxide,
bis(5-chloro-2,3,4-trihydroxyphenyl)sulfoxide,
bis(2,4,6-trihydroxyphenyl)sulfoxide, and
bis(5-chloro-2,4,6-trihydroxyphenyl)sulfoxide.

Among the substituents shown in "Chemical formula 2" above, examples of the case in which a substituent is a fifth substituent having two phenyl groups, and Z is —C(=O)— include,
2,4-dihydroxybenzophenone, 2,3,4-trihydroxybenzophenone,
2,2',4,4'-tetrahydroxybenzophenone,
2,2',5,6'-tetrahydroxybenzophenone,
2-hydroxy-4-methoxybenzophenone,
2-hydroxy-4-octoxybenzophenone,
2-hydroxy-4-dodecyloxybenzophenone,
2,2'-dihydroxy-4-methoxybenzophenone,
2,6-dihydroxy-4-methoxybenzophenone,
2,2'-dihydroxy-4,4'-dimethoxybenzophenone,
4-amino-2'-hydroxybenzophenone,
4-dimethylamino-2'-hydroxybenzophenone,
4-diethylamino-2'-hydroxybenzophenone,
4-dimethylamino-4'-methoxy-2'-hydroxybenzophenone,
4-dimethylamino-2',4'-dihydroxybenzophenone, and
4-dimethylamino-3',4'-dihydroxybenzophenone.

When the structure is present at the side chain of the polymer, the ratio of the repeating unit including the structure occupied in the polymer is within a range in which the light transmittance of the release layer 4 is 0.001% or more and 10% or less. When a polymer is prepared such that the proportion is within the range, the release layer 4 sufficiently absorbs light, and thus the polymer can be reliably and quickly altered. That is, it is easy to remove the support plate 2 from the laminate 10, and it is possible to reduce light irradiation time required for the removal.

The structures can absorb light having a wavelength in the desired range by selection of the type. For example, the wavelength of light that can be absorbed by the structure is preferably within a range of 100 nm to 2,000 nm. In the range, the wavelength of light that can be absorbed by the structure is close to shorter wavelength side, and for example, the wavelength is within a range of 100 nm to 500 nm. For example, preferably, by absorbing ultraviolet rays having a wavelength in a range of 300 nm to 370 nm, a polymer including the structure can be altered.

Examples of the light that can be absorbed by the structure include light emitted from a high-pressure mercury lamp (wavelength: 254 nm or more and 436 nm or less), KrF excimer laser (wavelength: 248 nm), ArF excimer laser (wavelength: 193 nm), F2 excimer laser (wavelength: 157 nm), XeCl laser (wavelength: 308 nm), XeF laser (wavelength: 351 nm), or solid-state UV laser (wavelength: 355 nm), or g-rays (wavelength: 436 nm), h-rays (wavelength: 405 nm) or i-rays (wavelength: 365 nm).

The above-described release layer 4 contains a polymer including the structure as a repeating unit, and the release layer 4 can further contain components other than the polymer. Examples of the components include a filler, a plasticizer, and components that can improve the release properties of the support plate 2. These components are suitably selected from substances or materials known in the related art which promote or do not inhibit absorption of light by the structure and alteration of the polymer.

Inorganic Substance

The release layer 4 may be formed of an inorganic substance. When the release layer 4 is formed of the inorganic substance, the release layer is altered by absorbing light and as a result, the release layer loses strength or adhesiveness before being irradiated with light. Therefore, by applying a slight external force (for example, lifting the support plate 2), the release layer 4 is broken, and thus it is possible to easily separate the support plate 2 and the substrate 1.

The inorganic substance may be configured to be altered by absorbing light. For example, one or more inorganic substances selected from the group consisting of a metal, a metal compound and carbon can be suitably used. The metal compound refers to a compound including a metal atom, and for example, the metal compound can be metal oxides, and metal nitrides. Examples of the inorganic substance include one or more inorganic substances selected from the group consisting of gold, silver, copper, iron, nickel, aluminum, titanium, chromium, $SiO_2$, SiN, $Si_3N_4$, TiN and carbon, but the inorganic substance is not limited thereto. Moreover, the carbon can also include allotrope of carbon, and examples of the carbon include a diamond, fullerene, diamond-like carbon, and a carbon nanotube.

The inorganic substance absorbs light having a wavelength in a specific range depending on the type. By irradiating the release layer with light having a wavelength in the range that the inorganic substance used in the release layer 4 absorbs, the inorganic substance is suitably altered.

As the light with which the release layer 4 formed of the inorganic substance is irradiated, laser light such as solid-state laser including YAG laser, ruby laser, glass laser, $YVO_4$ laser, LD laser, and fiber laser, liquid laser such as dye laser, gas laser such as $CO_2$ laser, excimer laser, Ar laser, and He—Ne laser, semiconductor laser and free electron laser, or non-laser light may be used appropriately according to the wavelength which can be absorbed by the inorganic substance.

The release layer 4 formed of the inorganic substance can be formed on the support plate 2, for example, by known techniques such as sputtering, chemical vapor deposition (CVD), plating, plasma CVD, spin coating and the like. The thickness of the release layer 4 formed of the inorganic substance is not particularly limited, and the thickness may be a thickness that can sufficiently absorb light to be used. For example, the thickness is more preferably within a range of 0.05 μm to 10 μm. In addition, after both sides or one side of an inorganic film (for example, a metal film) formed of the inorganic substance constituting the release layer 4 is coated with an adhesive in advance, the support plate 2 may be bonded to the substrate 1.

When a metal film is used as a release layer 4, reflection of the laser or charging to the film may occur depending on the conditions such as the film quality of the release layer 4, a type of a laser source, and a laser output. Therefore, it is preferable to take countermeasures for these problems by providing an antireflection film or an antistatic film on and beneath or any one side of the release layer 4.

Compound Having Structure with Infrared Ray Absorption Properties

The release layer 4 may be formed of a compound having a structure with infrared ray absorption properties. The compound is altered by absorbing the infrared rays. As a result of the alteration, the release layer 4 loses the strength and the adhesiveness before being irradiated with infrared rays. Therefore, by applying a slight external force (for example, lifting the support), the release layer 4 is broken, and thus it is possible to easily separate the support plate 2 and the substrate 1.

Examples of the structure having infrared ray absorption properties, or the compounds including the structure having infrared ray absorption properties include alkane, alkene (vinyl, trans, cis, vinylidene, trisubstituted, tetrasubstituted, conjugated, cumulene, cyclic), alkyne (monosubstituted, disubstituted), a monocyclic aromatic group (benzene, monosubstituted, disubstituted, trisubstituted), alcohols and phenols (free OH, intramolecular hydrogen bond, intermolecular hydrogen bond, saturated secondary, saturated tertiary, unsaturated secondary, unsaturated tertiary), acetal, ketal, aliphatic ether, aromatic ether, vinyl ether, oxirane ring ether, ether peroxides, ketone, dialkyl carbonyl, aromatic carbonyl, enol of 1,3-diketone, o-hydroxy aryl ketone, dialkyl aldehyde, aromatic aldehyde, carboxylic acid (dimer, carboxylate anion), formic acid ester, acetic acid ester, conjugated ester, non-conjugated ester, aromatic ester, lactone (β-, γ-, δ-), aliphatic acid chloride, aromatic acid chloride, acid anhydride (conjugated, non-conjugated, cyclic, acyclic), primary amide, secondary amide, lactam, primary amine (aliphatic, aromatic), secondary amine (aliphatic, aromatic), tertiary amine (aliphatic, aromatic), primary amine salt, secondary amine salt, tertiary amine salt, ammonium ions, aliphatic nitrile, aromatic nitrile, carbodiimide, aliphatic isonitrile, aromatic isonitrile, isocyanic ester, thiocyanic ester, aliphatic isothiocyanic ester, aromatic isothiocyanic ester, aliphatic nitro compounds, aromatic nitro compounds, nitroamine, nitrosoamine, nitric ester, nitrite ester, a nitroso bond (aliphatic, aromatic, monomer, dimer), sulfur compounds such as mercaptan, thiophenol and thiol acid, a thiocarbonyl group, sulfoxide, sulfone, sulfonyl chloride, primary sulfonamide, secondary sulfonamide, sulfuric ester, a carbon-halogen bond, a Si-$A^1$ bond ($A^1$ is H, C, O, or a halogen), a P-$A^2$ bond ($A^2$ is H, C, or O) or a Ti—O bond.

Examples of the structure including the carbon-halogen bond described above include —$CH_2Cl$, —$CH_2Br$, —$CH_2I$, —$CF_2$—, —$CF_3$, —CH=$CF_2$, —CF=$CF_2$, aryl fluoride, and aryl chloride.

Examples of the structure including the Si-$A^1$ bond described above include SiH, $SiH_2$, $SiH_3$, Si—$CH_3$, Si—$CH_2$—, Si—$C_6H_5$, a SiO-aliphatic group, Si—$OCH_3$, Si—$OCH_2CH_3$, Si—$OC_6H_5$, Si—O—Si, Si—OH, SiF, $SiF_2$, and $SiF_3$. As the structure including the Si-$A^1$ bond, in particular, a siloxane skeleton and a silsesquioxane skeleton are preferably formed.

Examples of the structure including the P-$A^2$ bond described above include PH, $PH_2$, P—$CH_3$, P—$CH_2$—, P—$C_6H_5$, $A^3{}_3$-P—O ($A^3$ represents an aliphatic group or an aromatic group), $(A^4O)_3$+P—O ($A^4$ represents alkyl), P—$OCH_3$, P—$OCH_2CH_3$, P—$OC_6H_5$, P—O—P, P—OH, and O=P—OH.

The above-described structures can absorb infrared rays having a wavelength in the desired range by selecting the type thereof. Specifically, for example, the wavelength of infrared rays that can be absorbed by the structure is in the range of 1 μm to 20 μm, and the structure can more preferably absorb the wavelength in the range of 2 μm to 15 μm. Furthermore, in a case in which the structure is a Si—O bond, a Si—C bond and a Ti—O bond, the wavelength can be in the range of 9 μm to 11 μm. Moreover, those skilled in the art can easily understand the wavelength of infrared rays that can be absorbed by each structure. For example, as an absorption band in each structure, pp. 146 to 151 of non-patent literature: "Spectrometric identification of organic compounds—combined use of MS, IR, NMR, UV—(5th edition)", written by SIVERSTEIN, BASSLER AND MORRILL (published in 1992) can be referred to.

The compound having a structure with infrared ray absorption property used in the formation of the release layer 4 is not particularly limited as long as the compound can be dissolved in a solvent for coating, and can be solidified to form a solid layer among the compounds having the above-described structures. However, in order to easily separate the support plate 2 and the substrate 1 by effectively altering the compound in the release layer 4, it is preferable that absorption of infrared rays in the release layer 4 is increased, that is, the transmittance of infrared rays when the release layer 4 is irradiated with infrared rays is reduced. Specifically, the transmittance of infrared rays in the release layer 4 is preferably less than 90%, and the transmittance of infrared rays is more preferably less than 80%.

For example, as the compound having a siloxane skeleton, a resin which is a copolymer having a repeating unit represented by the following formula (3) and a repeating unit represented by the following formula (4), or a resin which is a copolymer having a repeating unit represented by the following formula (3) and a repeating unit derived from acrylic compound can be used.

[Chemical formula 4]

(3)

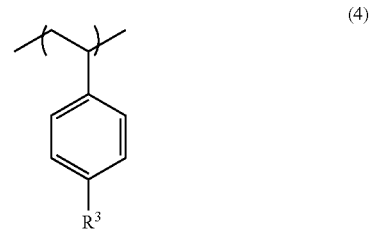

(4)

(In formula (4), $R^3$ represents a hydrogen atom, an alkyl group having 10 or less carbon atoms, or an alkoxy group having 10 or less carbon atoms.)

Among these, as the compound having a siloxane skeleton, t-butylstyrene (TBST)-dimethylsiloxane copolymer which is a copolymer having a repeating unit represented by the above formula (3) and a repeating unit represented by the following formula (5) is more preferable, and TBST-dimethylsiloxane copolymer which includes a repeating unit represented by the above formula (3) and a repeating unit represented by the following formula (5) at a ratio of 1:1 is even more preferable.

[Chemical formula 5]

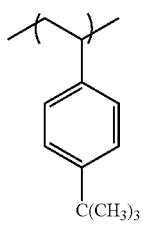

(5)

In addition, as the compound having a silsesquioxane skeleton, for example, a resin which is a copolymer having a repeating unit represented by the following formula (6) and a repeating unit represented by the following formula (7) can be used.

[Chemical formula 6]

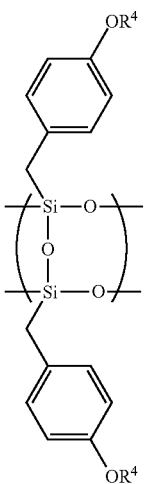

(6)

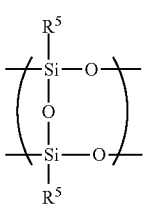

(7)

(In formula (6), $R^4$ represents a hydrogen atom or an alkyl group having 1 to 10 carbon atoms, and in formula (7), $R^5$ represents an alkyl group having 1 to 10 carbon atoms, or a phenyl group.)

In addition to the above compounds, as the compound having the silsesquioxane skeleton, each silsesquioxane resin disclosed in JP-A-2007-258663 (published in Oct. 4, 2007), JP-A-2010-120901 (published in Jun. 3, 2010), JP-A-2009-263316 (published in Nov. 12, 2009), and JP-A-2009-263596 (published in Nov. 12, 2009) can be suitably used.

Among these, as the compound having the silsesquioxane skeleton, a copolymer having a repeating unit represented by the following formula (8) and a repeating unit represented by the following formula (9) is more preferable, and a copolymer which includes a repeating unit represented by the following formula (8) and a repeating unit represented by the following formula (9) at a ratio of 7:3 is still more preferable.

[Chemical formula 7]

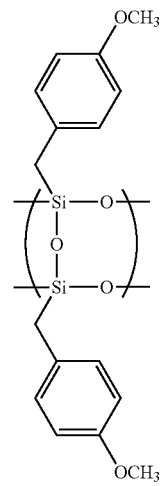

(8)

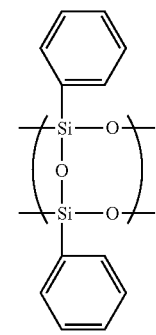

(9)

A polymer having the silsesquioxane skeleton can have a random structure, a ladder structure, or a basket structure, and may have any of these structures.

In addition, examples of the compound including a Ti—O bond include (i) alkoxy titanium such as tetra-i-propoxy titanium, tetra-n-butoxy titanium, tetrakis(2-ethylhexyloxy) titanium, and titanium-i-propoxy octylene glycolate; (ii) chelate titanium such as di-i-propoxy bis(acetylacetonato) titanium, and propanedioxy titanium bis(ethyl acetoacetate); (iii) titanium polymers such as i-$C_3H_7O$—[—Ti(O-i-$C_3H_7)_2$—O—]$_n$-i-$C_3H_7$, and n-$C_4H_9O$—[—Ti(O-n-$C_4H_9)_2$—O—]$_n$-n-$C_4H_9$; (iv) titanium acylates such as tri-n-butoxy titanium monostearate, titanium stearate, di-i-propoxy titanium diisostearate, and (2-n-butoxycarbonyl benzoyloxy) tributoxy titanium; and (v) water-soluble titanium compounds such as di-n-butoxy bis(triethanolaminato) titanium.

Among these, as the compound containing a Ti—O bond, di-n-butoxy-bis(triethanolaminato) titanium (Ti(OC$_4$H$_9$)$_2$[OC$_2$H$_4$N(C$_2$H$_4$OH)$_2$]$_2$) is preferable.

The release layer 4 contains a compound having a structure with infrared ray absorption properties, and the release layer 4 can further contain components other than the above-described compounds. Examples of the components include a filler, a plasticizer, and components that can improve the release properties of the support plate 2. These components are suitably selected from substances or materials known in the related art which promote or do not inhibit absorption of infrared rays by the structure and alteration of the compounds.

Infrared Ray Absorbing Substance

The release layer 4 may contain an infrared ray absorbing substance. By being constituted so as to contain the infrared ray absorbing substance, the release layer 4 is altered by absorbing light, and as a result, the release layer 4 loses strength or adhesiveness before being irradiated with light. Therefore, by applying a slight external force (for example, lifting the support plate 2), the release layer 4 is broken, and thus it is possible to easily separate the support plate 2 and the substrate 1.

The infrared ray absorbing substance may be configured to be altered by absorbing infrared rays. For example, carbon black, iron particles, or aluminum particles can be suitably used. The infrared ray absorbing substance absorbs light having a wavelength in a specific range depending on the type. By irradiating the release layer 4 with light having a wavelength in the range that the infrared ray absorbing substance used in the release layer 4 absorbs, the infrared ray absorbing substance is suitably altered.

Laminate Forming Process

As shown in (g) of FIG. 1, in the laminate forming process, the substrate 1, the adhesive layer 3, the release layer 4, and the support plate 2 are laminated in this order by temporarily fixing the substrate 1 and the support plate 2.

In the laminate forming process, the adhesive layer 3 formed on the substrate 1 is overlapped with the release layer 4 formed on the support plate 2 so as to face each other. In addition, a notch formed on the substrate 1 and a notch formed on the support plate 2 are arranged to be overlapped with each other so that the substrate 1 is overlapped with the support plate 2. Thus, the arrangement of the electrode d formed in the substrate 1 can be specified in the laminate 10 based on the notches of the substrate 1 and the support plate 2.

Then, a pair of plate members (not shown) for heating the laminate 10 is bonded to interpose the laminate therebetween.

Accordingly, the laminate 10 is formed. In the laminate forming process, the bonding temperature, the bonding pressure, and the bonding time at which the support plate 2 is bonded to the substrate 1 may be appropriately adjusted according to the type of the adhesive layer 3.

Thinning Process

As shown in (a) and (b) of FIG. 2, in the method for manufacturing the laminate 10 according to the embodiment, the substrate 1 is thinned until the step difference is eliminated in the substrate 1. In addition, as shown in (c) of FIG. 2, in the method for manufacturing the laminate 10 according to the embodiment, a device c is mounted on the substrate 1 in the laminate 10 after the thinning process is performed.

In the thinning process, as shown in (a) of FIG. 2, the laminate 10 is arranged such that the side of the support plate 2 in the laminate 10 is fixed and the substrate 1 is arranged on the upper side in the laminate 10. Thereafter, as shown in (b) of FIG. 2, the facing surface in which the step difference is formed in the substrate 1 of the laminate 10 is ground using a known unit such as a grinder from the rear side so as to make the substrate 1 thin.

In the thinning process, the substrate 1 is thinned by grinding the width h2 of the substrate 1 in the thickness direction shown in FIG. 3A such that the thickness is smaller than h1. Accordingly, while reducing the thickness of the substrate 1 to a predetermined thickness, the outer diameter of the substrate 1 can be set to W2 in the laminate 10. That is, the substrate 1 of the laminate 10 can be processed such that the outer diameter W2 of the substrate 1 is smaller than the inner diameter W3 of the cavity of the die 20 shown in FIG. 3B. Further, in the thinning process, the electrode d of the substrate 1 in the laminate 10 can be exposed on the ground surface of the substrate 1 by grinding the substrate 1 to a predetermined thickness.

Mounting of Device c

As shown in (c) of FIG. 2, in the method for manufacturing the laminate 10 according to the embodiment, a device c is mounted on the electrode d exposed on the ground surface of the substrate 1 in the laminate 10 after the thinning process is performed.

The laminate 10 is formed such that the notch formed on the substrate 1 is overlapped with the notch formed on the support plate 2. Therefore, even when the notch formed in the peripheral edge portion on the side of the substrate 1 is eliminated by grinding in the substrate thinning process, the direction of the substrate 1 can be specified based on the notch of the side of the support plate 2. Thus, in the substrate 1 of the laminate 10, the position of the electrode d is specified so that the device c can be mounted on the substrate 1.

Method for Manufacturing Sealed Substrate Laminate

Using FIGS. 1 to 3B, a method for manufacturing a sealed substrate laminate 11 according to an embodiment of the invention will be descried in more detail.

The method for manufacturing a sealed substrate laminate 11 according to this embodiment includes a sealed substrate forming process ((d) of FIG. 2) and a releasing process. In the sealed substrate forming process, after a laminate manufacturing process of manufacturing the laminate 10 and a thinning process are performed by the method for manufacturing a laminate according to one embodiment ((a) of FIG. 1 to (c) of FIG. 2), the substrate 1 of the laminate 10 is housed in the cavity of the die 20 and the cavity of the die 20 is covered with the support plate 2 of the laminate 10. Then, a sealing material is injected into a space between the die 20 and the laminate 10 and at least the substrate 1 is sealed with the sealing material to form a sealed substrate laminate 11. In the releasing process, after the sealed substrate forming process, the sealed substrate laminate 11 is released from the die 20. In the method for manufacturing a sealed substrate laminate 11 according to the embodiment, the laminate manufacturing process is the same as the method for manufacturing a laminate according to the above-described embodiment. Thus, the description thereof will be omitted.

Sealed Substrate Forming Process

As shown in (d) of FIG. 2, in the method for manufacturing the sealed substrate laminate 11 according to the embodiment, the laminate 10 is set to the die 20 such that the substrate 1 is housed in the cavity of the die 20 and then the cavity is covered with the support plate (support) 2. Thus, at least the substrate 1 is sealed by the sealing material 5 supplied to a space formed between the die 20 and the laminate 10 by covering the cavity. In the sealed substrate forming process, in order to prevent the sealing material from leaking from the space between the die 20 and the laminate 10, the sealing material may be injected into the cavity while applying pressure force to the support plate 2 with which the cavity of the die 20 is covered through the die 20, or the device c mounted on the substrate 1 may be sealed by supplying the sealing material 5 to the substrate 1 in the laminate 10 and applying pressure force to the laminate 10 using the die 20. In addition, in the sealed substrate forming process, after the sealing material 5 is injected into the die 20, the sealing material 5 may be cured through reaction by heating. Thus, the device c mounted on the substrate 1 is sealed.

In the method for manufacturing the sealed substrate laminate 11 according to the embodiment, since the cavity of the die 20 is covered with the support plate 2 in the laminate 10, without applying the pressure force that is applied by the die 20 to the substrate 1, the device c mounted on the substrate 1 can be sealed by the sealing material 5 ((d) of FIG. 2). Therefore, by heating the sealing material 5 injected into the cavity of the die 20, even when the adhesive layer 3 is softened in the laminate 10, the adhesive layer 3 can be suitably prevented from protruding from the peripheral edge portion of the laminate 10 by the pressure force applied by the die 20. Accordingly, it is possible to suitably prevent distortion of the substrate 1 in the laminate 10. In addition, in the method for manufacturing the sealed substrate laminate 11 according to the embodiment, the sealed substrate laminate 11 is manufactured from the laminate 10. That is, since the device c mounted on the substrate 1 can be sealed in a state in which the substrate 1 is supported with the support plate 2, while preventing the substrate 1 which is thinned to a thickness of 20 μm to 150 μm from being damaged by impact or the like, the device c that is mounted on the substrate 1 can be sealed.

As shown in (d) of FIG. 2, the cavity of the die 20 is covered with the surface in which the release layer 4 is formed in the support plate 2 of the laminate 10. Accordingly, in the sealed substrate forming process, it is possible to prevent the sealing material 5 from adhering directly to the support plate 2 and being cured.

Sealing Material 5

In the sealed substrate forming process, for the sealing material for sealing the device c mounted on the substrate 1, for example, those including a polyimide resin, an epoxy resin, a resin including an acid anhydride and the like can be used.

Die 20

The die 20 is provided for molding the sealing material for sealing the substrate 1. For example, the die 20 may be used to seal the substrate 1 by injecting the sealing material 5 for sealing the device c mounted on the substrate 1 into the cavity of the die 20 through an injection port (not shown) which is communicatively formed from the inside to the outside. In addition, the die 20 may be used to seal the device c mounted on the substrate 1 by supplying the sealing material 5 to the substrate 1, and applying pressure force to the laminate 10 to which the sealing material 5 is supplied by the die. Further, a treatment of applying a releasing agent for easily releasing the sealed substrate laminate or the like may be performed inside the cavity of the die 20. The type of the die may be appropriately selected according to the type of the sealing material or the type of the laminate.

As shown in FIG. 3B, the inner diameter of the cavity in the die 20 is represented by W3. It is preferable that the inner diameter W3 is smaller than the outer diameter W1 of the support plate 2 and is larger than the outer diameter W2 of the substrate 1. Thus, the cavity of the die 20 can be suitably covered with the support plate 2 ((d) of FIG. 2 and FIG. 3B). Accordingly, the inner diameter of the cavity of the die 20 may be appropriately adjusted according to the outer diameter of the substrate after the thinning process is performed and the outer diameter of the support plate. However, as long as the cavity having an inner diameter W3 which is 0.5 mm to 2 mm larger than the outer diameter W2 of the substrate 1 is provided, without setting excessive alignment, the substrate 1 can be suitably housed inside the cavity and the cavity of the die 20 can be suitably covered with the support plate 2.

In addition, the depth of the cavity of the die 20 may be appropriately adjusted in consideration of a width h obtained by adding the thickness of the adhesive layer 3 to the width h1 of the substrate 1 in the laminate 10 and the size of the mounted device (FIG. 3B).

Releasing Process

As shown in (e) of FIG. 2, in the releasing process, the sealed substrate laminate 11 is released from the die 20. Thus, the sealed substrate laminate 11 with reduced distortion in the substrate 1 can be manufactured. As shown in (f) of FIG. 2, after the releasing process, the extra portion of the sealing material 5 in the sealed substrate laminate 11 may be removed by grinding.

Sealed Substrate Laminate 11

As shown in (f) of FIG. 2, the sealed substrate laminate 11 including the laminate 10 formed by laminating the substrate 1, the adhesive layer 3, the release layer 4 altered by light absorption, and the support plate (support) 2 formed of a light transmitting material in this order, and the sealing material 5 which seals the substrate 1, the adhesive layer 3, and the release layer 4 in which the peripheral edge of the sealing material 5 is positioned on the inner side of the peripheral edge of the support plate 2 is also encompassed in the scope of the invention.

When the sealed substrate laminate having the above-described configuration is used, a sealed substrate with reduced distortion in the substrate can be suitably manufactured.

Method for Manufacturing Sealed Substrate

A method for manufacturing a sealed substrate 6 according to an embodiment of the invention includes a sealed substrate laminate manufacturing process of manufacturing the sealed substrate laminate 11 according to the embodiment of the invention, and a separation process ((g) and (f) of FIG. 2) of separating the support plate 2 from the sealed substrate laminate 11 by irradiating the release layer 4 with light though the support plate 2 to alter the release layer 4 after the sealed substrate laminate manufacturing process. The sealed substrate laminate manufacturing process is the same as the method for manufacturing the sealed substrate laminate according to the above-describe embodiment. Thus, the description will be omitted.

Separation Process

As shown in (g) of FIG. 2, in the separation process, the release layer 4 is irradiated with light through the support plate 2. Thus, the release layer 4 of the sealed substrate laminate 11 is altered.

In the specification, the term "alter" of the release layer refers to a phenomenon in which the release layer becomes a state in which the release layer may be broken in response to a slight external force, or the adhesive force with the layers in contact with the release layer is decreased. The alteration of the release layer can be (pyrogenic or non-pyrogenic) decomposition, crosslinking, change in a conformation or dissociation of a functional group (and hardening, degasification, contraction or expansion of the release layer associated with these) due to the energy of the absorbed light.

As described above, by altering the release layer 4, the adhesive force of the release layer 4 can be decreased. Here, as shown in (g) of FIG. 2, in the sealed substrate laminate 11, the sealing material 5 is prevented from adhering directly to the support plate 2 by the release layer 4. Therefore, not only the release layer 4 between the adhesive layer 3 and the support plate 2 but also the release layer 4 between the sealing material 5 and the support plate 2 can be altered by performing the separation process. Accordingly, by applying a slight force to the sealed substrate laminate 11, the support plate 2 can be separated from the sealed substrate 6 ((h) of FIG. 2).

In the separation process, the laser which emits light with which the release layer 4 is irradiated can be appropriately selected according to the material constituting the release layer 4 and laser which emits light having a wavelength with which the material constituting the release layer 4 can be altered can be selected.

In the separation process, the laser irradiation conditions may be appropriately selected according to the type of the release layer and the conditions are not particularly limited. However, the average output value of the laser light is preferably within a range of 1.0 W to 5.0 W, and more preferably within a range of 3.0 W to 4.0 W. In addition, the repetition frequency of the laser light is preferably within a range of 20 kHz to 60 kHz and more preferably within a range of 30 kHz to 50 kHz. Furthermore, the wavelength of the laser light is preferably 300 nm or more and 700 nm or less, and more preferably 450 nm or more and 650 nm or less. According to such conditions, the energy of pulse light with which the release layer 4 is irradiated can be set under an appropriate condition for altering the release layer 4. Therefore, it is possible to prevent the sealed substrate 6 from being damaged by the laser light.

In addition, the beam spot diameter of the pulse light and the irradiation pitch of the pulse light may be a diameter with which the beam spot does not overlap with an adjacent beam spot and a pitch which makes it possible to alter the release layer 4.

Sealed Substrate 6

The sealed substrate 6 manufactured by the method for manufacturing the sealed substrate 6 according to the invention is also encompassed in the scope of the invention ((h) of FIG. 2). In the subsequent process, a semiconductor chip is formed by removing a residue of the adhesive layer 3 and the release layer 4 in the sealed substrate 6, and performing a dicing process.

In the sealed substrate 6 shown in (h) of FIG. 2, the device c of the substrate 1 is sealed with the sealing material 5 without pressing the die 20 against the substrate 1. Accordingly, distortion of the substrate 1 in the sealed substrate 6 occurring when the device c is sealed is reduced. In addition, in the sealed substrate 6, while specifying the direction of the substrate 1 based on the notches formed in the substrate 1 and the support plate 2, the substrate 1 is processed. Therefore, the device c is mounted at an appropriate position on the sealed substrate 6.

In contrast, as a known method for sealing a device formed on a substrate in a laminate, a method including, when bonding a substrate and a support plate which have the same size to form a laminate in order to form a semiconductor chip with a high yield, while pressing a die having an inner diameter of the cavity being smaller than an outer diameter of the substrate against the substrate at the time of sealing the device on the substrate, injecting a sealing material into the cavity to seal the device of the substrate, or a method including arranging a laminate inside a die having an inner diameter of the cavity being larger than outer diameters of the substrate and the support plate and injecting a sealing material to seal the device of the substrate is adopted.

In the former method, since pressure force is applied to the substrate by the die, the adhesive layer protrudes from the peripheral edge portion of the laminate and thus distortion occurs in the substrate. In addition, in the latter method, since a wider space formed by the die to seal the substrate is provided, the amount of the sealing material used to seal the device of the substrate is increased.

For example, in order to prevent chipping in the substrate which is commercially available and has an outer diameter of 300 mm in the thinning process, there is provided a substrate which is trimmed with a width of about 0.5 mm from the terminal portion of the outer peripheral portion of the substrate toward the inside in advance. When a laminate is formed using such a substrate and the substrate is thinned, the outer diameter of the substrate becomes about 1 mm smaller than the outer diameter of the support plate in some cases. Then, in the laminate, it is difficult to cover the cavity of the die with the support plate and seal the device on the substrate.

The invention is not limited to the exemplary embodiments described above, and may be altered within the scope of the aspects. An embodiment derived from a proper combination of technical means respectively disclosed in different embodiments is encompassed in the technical scope of the invention.

Examples

Sealed Substrate Manufacturing Evaluation

For sealed substrate manufacturing evaluation, in a laminate prepared using a substrate in which a step difference was formed in a peripheral edge portion, and a laminate prepared using a substrate in which a step difference was not formed in a peripheral edge portion, the substrate was sealed using the same die to evaluate the presence of protrusion of an adhesive in the sealed substrate laminate. In addition, a separation process was performed on the sealed substrate laminate in which the substrate was sealed to evaluate the separability of the sealed substrate.

Preparation of Laminate

First, a step difference was formed in a peripheral edge portion of a substrate used for forming a laminate of Example 1. As the substrate, a semiconductor wafer substrate (having an outer diameter of 300 mm and formed of silicon) having a thickness of 775 μm was used and a step difference was formed in the substrate 1 using a trimmer grinder (manufactured by DISCO Corporation) such that a width W2 was 290 mm and a width h1 was 150 μm in a substrate shown in FIG. 3A (step difference formation process).

Next, TZNR (registered trademark)-A4004 (manufactured by Tokyo Ohka Kogyo Co., Ltd.) was applied to the surface in which a step difference was formed in the semiconductor wafer substrate by spin coating, and the coating film was baked at each temperature of 90° C., 160° C., and 220° C. for 4 minutes. Thus, an adhesive layer (having a thickness of 50 μm) was formed. Thereafter, while rotating the semiconductor wafer substrate in which the adhesive layer was formed at 1,500 rpm, by supplying a TZNR (registered trademark)-HC thinner (manufactured by Tokyo Ohka Kogyo Co., Ltd.) to the substrate at a feed rate of 10 cc/minute for 3 minutes to 5 minutes using an EBR nozzle, the adhesive layer was removed in a region having a trim width (Wa) toward the inside based on the end portion of the wafer substrate in the outer peripheral portion of the adhesive layer formed in the outer peripheral portion of the semiconductor wafer substrate.

Next, a bare glass support (having an outer diameter of 300 mm and a thickness of 700 μm) was used as a support, and a release layer was formed on the support by a plasma CVD method using fluorocarbon. The release layer was formed by a CVD method using $C_4F_8$ as reaction gas under the conditions of a flow rate of 400 sccm, a pressure of 700 mTorr, a high-frequency power of of 2,500 W, and a deposition temperature of 240° C. By performing the CVD method, a fluorocarbon film (having a thickness of 1 μm) which is a release layer was formed on the support (release layer forming process).

Next, the wafer substrate, the adhesive layer, the release layer, and the glass support overlapped in this order and the layers were pre-heated in vacuum at 215° C. for 180 seconds and then pressed with a bonding pressure of 4,000 kgf for 300 seconds to bond the glass support and the wafer substrate. Thus, a laminate to be used in Example 1 was prepared (laminate forming process).

Next, a laminate of Example 2 was manufactured in the same procedures as in Example 1 except that TZNR (regby APIC YAMADA CORPORATION) was used to seal the substrate in each of the laminates of Examples 1 to 3 and Comparative Examples 1 to 3 (sealed substrate forming process).

In the laminates of Examples 1 to 3, since the outer diameter (290 mm) of the semiconductor wafer substrate was smaller than the inner diameter (292 mm) of the cavity of the die, a sealing material was injected into a space formed by arranging the semiconductor wafer substrate inside the cavity and covering the cavity with the bare glass support, and thus the semiconductor wafer substrate was sealed. In addition, in the laminates of Comparative Examples 1 to 3, since the outer diameter (299 mm) of the semiconductor wafer substrate was larger than the inner diameter (292 mm) of the cavity of the die, a sealing material was injected into a space formed by covering the cavity with the semiconductor wafer substrate and thus the semiconductor wafer substrate was sealed.

Then, the presence of protrusion of the adhesive layer in the peripheral edge portion of each laminate was evaluated. The presence of protrusion of the adhesive layer was visually evaluated. When the protrusion of the adhesive layer was not confirmed in the peripheral edge portion of the laminate, the laminate was evaluated as "O" and when the protrusion of the adhesive layer was confirmed, the laminate was evaluated as "X". The results of evaluating the pressure force applied to the die, temperature, and the presence of protrusion of the adhesive layer when the substrate of each laminate was sealed are shown in Table 1 below.

TABLE 1

| | | Example 1 | Example 2 | Example 3 | Comparative Example 1 | Comparative Example 2 | Comparative Example 3 |
|---|---|---|---|---|---|---|---|
| Adhesive | | A4004 | A4027 | A4017 | A4004 | A4027 | A4017 |
| Outer diameter of semiconductor wafer substrate (mm) | | | 290 | | | 299 | |
| Inner diameter of cavity of die (mm) | | | | | 292 | | |
| Sealing condition 1 | 120° C. 150 kN | O | O | O | O | O | O |
| Sealing condition 2 | 160° C. 150 kN | O | O | O | X | X | X | istered trademark)-A4027 (manufactured by Tokyo Ohka Kogyo Co., Ltd.) was used as an adhesive. In addition, a laminate of Example 3 was manufactured in the same procedures as in Examples 1 and 2 except that TZNR (registered trademark)-A4017 (manufactured by Tokyo Ohka Kogyo Co., Ltd.) was used as an adhesive.

Next, laminates of Comparative Examples 1 to 3 were formed in the same procedures as in Examples 1 to 3 except that a step difference was not formed on the semiconductor wafer substrate. The laminates of Examples 1 to 3 and Comparative Examples 1 to 3 are shown in Table 1 below.
Evaluation of Sealed Substrate Laminate In each of the above-described laminates of Examples 1 to 3 and Comparative Examples 1 to 3, the substrate was thinned by a back grinding apparatus (manufactured by DISCO Corporation) to have a thickness of 50 μm (thinning process). In the above-described laminates of Examples 1 to 3 and Comparative Examples 1 to 3, the outer diameter W2 of the substrate after the thinning process is as shown in Table 1 below.

Next, a molding machine including a die provided with a cavity having an inner diameter of 292 mm (manufactured As shown in Table 1, when the semiconductor wafer substrates were sealed while setting the pressure force to the laminates by the die to 150 kN under the temperature condition of 120° C., in all of the laminates of Examples 1 to 3 and Comparative Examples 1 to 3, the protrusion of the adhesive layer was not confirmed (O). In contrast, when the semiconductor wafer substrates were sealed while setting the pressure force to the laminates by the die to 150 kN under the temperature condition of 160° C., in the laminates of Examples 1 to 3, the protrusion of the adhesive layer was not confirmed (O). However, in all of the laminates of Comparative Examples 1 to 3, the protrusion of the adhesive layer was confirmed (X). From these results, in the laminates of Examples 1 to 3, even when the semiconductor wafer substrate was sealed under a high temperature condition, it was confirmed that it was possible to prevent the protrusion of the adhesive layer.
Evaluation of Separability Next, the separation process was performed using the laminate of Example 1 and the separability between the glass support and the sealed substrate was evaluated. In the separation process, the release layer was irradiated with laser light under the conditions of a wavelength of 532 nm, a repetition frequency of 40 kHz, a laser scanning rate of 6,500 mm/second, and a laser spot pitch of 180 μm.

Evaluation Results

It could be confirmed that when the laminate of Example 1 was subjected to the separation process, not only the adhesive force between the glass support and the adhesive layer but also the adhesive force between the glass support and the sealed material could be decreased and thus the sealed substrate could be suitably separated from the sealed substrate laminate. Accordingly, it could be confirmed that when the cavity of the die was covered with the glass support in which the release layer was formed, the adhesive force between the glass support and the sealing material could be decreased by altering the release layer.

The invention can be suitably used, for example, in a process of manufacturing a miniaturized semiconductor device.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for manufacturing a laminate, comprising:
   forming a step difference by grinding a periphery edge portion of a substrate to have such a size that a surface on an inner side of the step difference can be housed in a cavity of a die; and
   forming a laminate by laminating the substrate, an adhesive layer, a release layer altered by light absorption, and a support formed of a light transmitting material in this order after the forming of the step difference,
   wherein in the forming of the laminate, the substrate is laminated such that the surface on the inner side of the step difference of the substrate faces the support.

2. The method for manufacturing a laminate according to claim 1, further comprising:
   thinning the substrate from a rear side of a facing surface in which the step difference is formed until the step difference is eliminated after the forming of the laminate.

3. A method for manufacturing a sealed substrate laminate, comprising:
   manufacturing a laminate by the method according to claim 2;
   forming a sealed substrate laminate by sealing at least the substrate with a sealing material supplied to a space which formed between the die and the laminate by setting the laminate in the die such that the substrate is housed in the cavity of the die and covering the cavity with the support after the thinning of the substrate; and
   releasing the sealed substrate laminate from the die after the forming of the sealed substrate laminate.

4. A method for manufacturing a sealed substrate, comprising:
   manufacturing a sealed substrate laminate by the method according to claim 3; and
   separating the support from the sealed substrate laminate by irradiating the release layer with light through the support and altering the release layer after the manufacturing of the sealed substrate laminate.

5. The method for manufacturing a laminate according to claim 1, wherein in the laminate forming process, a notched portion formed on the substrate and a notched portion formed on the support are arranged to be overlapped with each other so that the substrate is overlapped with the support.

* * * * *